(12) United States Patent
Ishigaki et al.

(10) Patent No.: US 10,181,477 B2
(45) Date of Patent: Jan. 15, 2019

(54) SEMICONDUCTOR DEVICE AND METHOD FOR MANUFACTURING SAME

(71) Applicant: Toshiba Memory Corporation, Minato-ku (JP)

(72) Inventors: Hirokazu Ishigaki, Yokkaichi (JP); Tatsuya Okamoto, Inabe (JP); Masao Shingu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/262,274

(22) Filed: Sep. 12, 2016

(65) Prior Publication Data

US 2017/0263633 A1    Sep. 14, 2017

Related U.S. Application Data

(60) Provisional application No. 62/307,146, filed on Mar. 11, 2016.

(51) Int. Cl.
*H01L 29/792* (2006.01)
*H01L 27/11582* (2017.01)
(Continued)

(52) U.S. Cl.
CPC .. *H01L 27/11582* (2013.01); *H01L 21/02233* (2013.01); *H01L 21/28282* (2013.01); *H01L 27/11568* (2013.01); *H01L 29/30* (2013.01)

(58) Field of Classification Search
CPC .............. H01L 21/02233; H01L 29/30; H01L 27/11568; H01L 27/11563–27/11582; H01L 2924/14511; H01L 21/28282; H01L 29/4234–29/42352; H01L 29/518; H01L 29/792–29/7926; G11C 16/0466

See application file for complete search history.

(56) References Cited

U.S. PATENT DOCUMENTS 8,853,089 B2    10/2014  Ohtsuki et al.
2011/0233648 A1  9/2011  Seol et al.
(Continued)

FOREIGN PATENT DOCUMENTS

JP    7-37834     2/1995
JP    10-214816   8/1998
(Continued)

*Primary Examiner* — Moazzam Hossain
*Assistant Examiner* — Stanetta Isaac
(74) *Attorney, Agent, or Firm* — Oblon, McClelland, Maier & Neustadt, L.L.P.

(57) ABSTRACT

According to the embodiment, a semiconductor device includes: a substrate; a stacked body provided on the substrate and including a plurality of electrode layers stacked with an insulator interposed; a semiconductor pillar provided on the substrate and in the stacked body; a semiconductor body provided in the stacked body; and an insulating film including a charge storage film provided between the plurality of electrode layers and the semiconductor body, and extending in the stacking direction. The semiconductor body includes a first portion and a second portion. The first portion is surrounded with the plurality of electrode layers and extends in a stacking direction of the stacked body. The second portion is in contact with an upper surface of the semiconductor pillar.

12 Claims, 13 Drawing Sheets

(51) Int. Cl.
  *H01L 29/30*     (2006.01)
  *H01L 27/11568*  (2017.01)
  *H01L 21/28*     (2006.01)
  *H01L 21/02*     (2006.01)

(56) References Cited

U.S. PATENT DOCUMENTS

| | | |
|---|---|---|
| 2013/0334593 A1 | 12/2013 | Seol et al. |
| 2015/0102346 A1* | 4/2015 | Shin .................... H01L 27/1157 |
| | | 257/66 |
| 2015/0206900 A1* | 7/2015 | Nam ................. H01L 27/11582 |
| | | 257/326 |
| 2015/0311301 A1 | 10/2015 | Seol et al. |

FOREIGN PATENT DOCUMENTS

| | | |
|---|---|---|
| JP | 2011-211200 | 10/2011 |
| JP | 2014-236089 | 12/2014 |
| JP | 5673601 | 2/2015 |

* cited by examiner

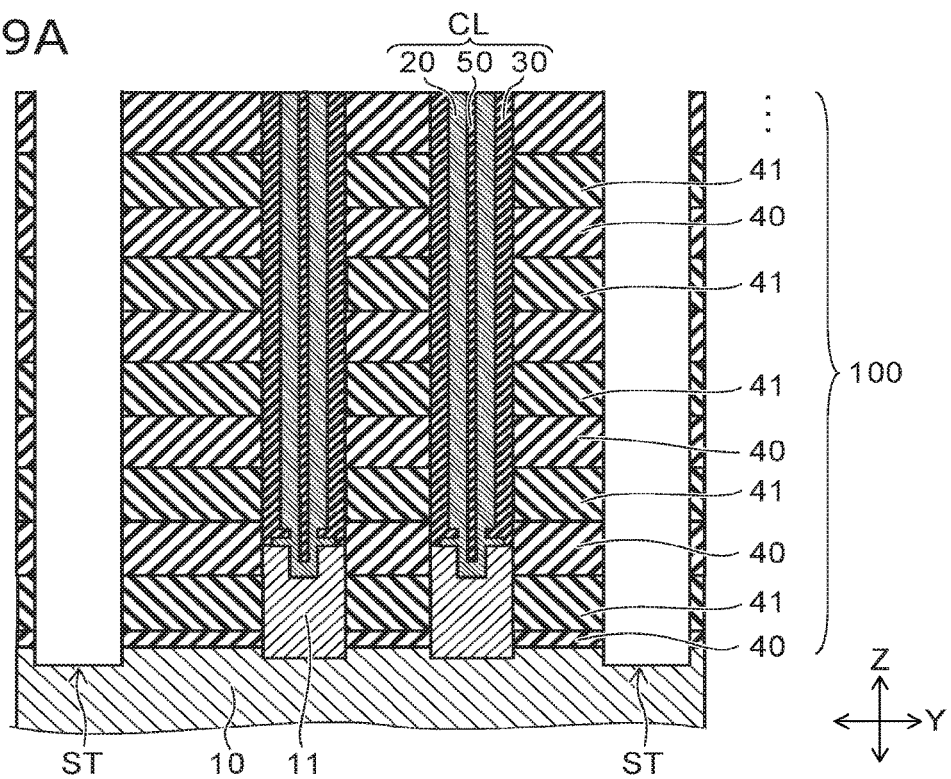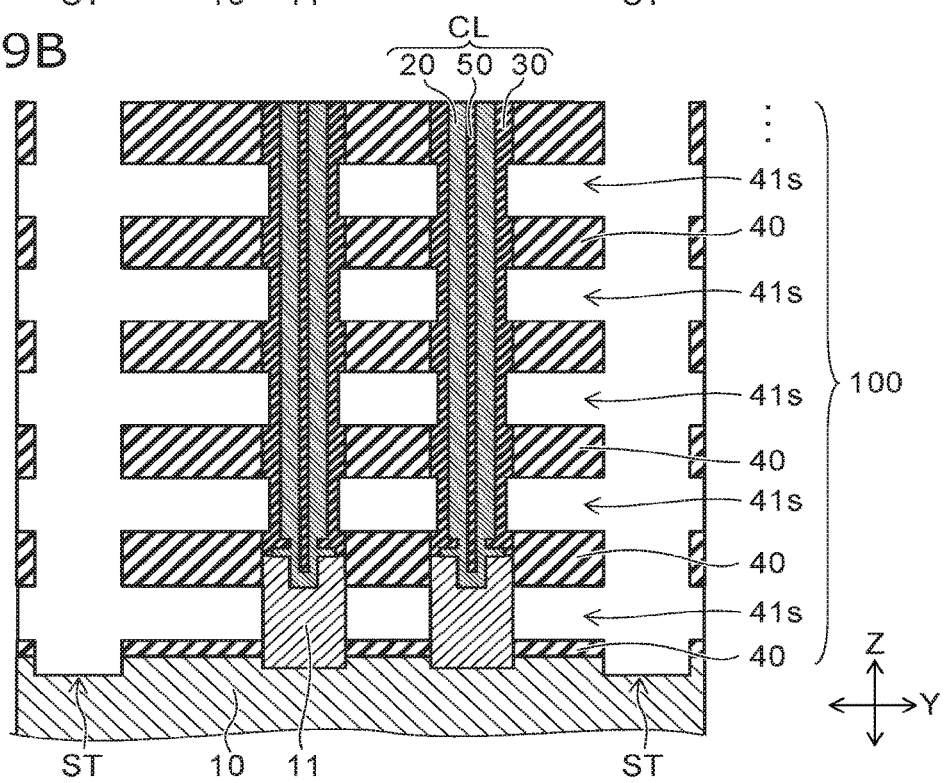

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/307,146, filed on Mar. 11, 2016; the entire contents of which are incorporated herein by reference.

FIELD

Embodiments described herein relate generally to a semiconductor device and a method for manufacturing the same.

BACKGROUND

A memory device having a three-dimensional structure has been proposed in which a memory hole is made in a stacked body in which multiple electrode layers are stacked, and a charge storage film and a semiconductor body are provided to extend in a stacking direction of the stacked body inside the memory hole. The memory device includes multiple memory cells connected in series between a drain-side selection transistor and a source-side select transistor. The electrode layers of the stacked body are used as gate electrodes of the drain-side select transistor, the source-side select transistor, and the memory cell. A status of interface between the semiconductor body and a semiconductor pillar provided on a substrate affects a cell current.

BRIEF DESCRIPTION OF THE DRAWINGS

FIG. 5A to FIG. 9B are schematic cross-sectional views showing a method for manufacturing the semiconductor device of the first embodiment;

DETAILED DESCRIPTION

Figure 1:
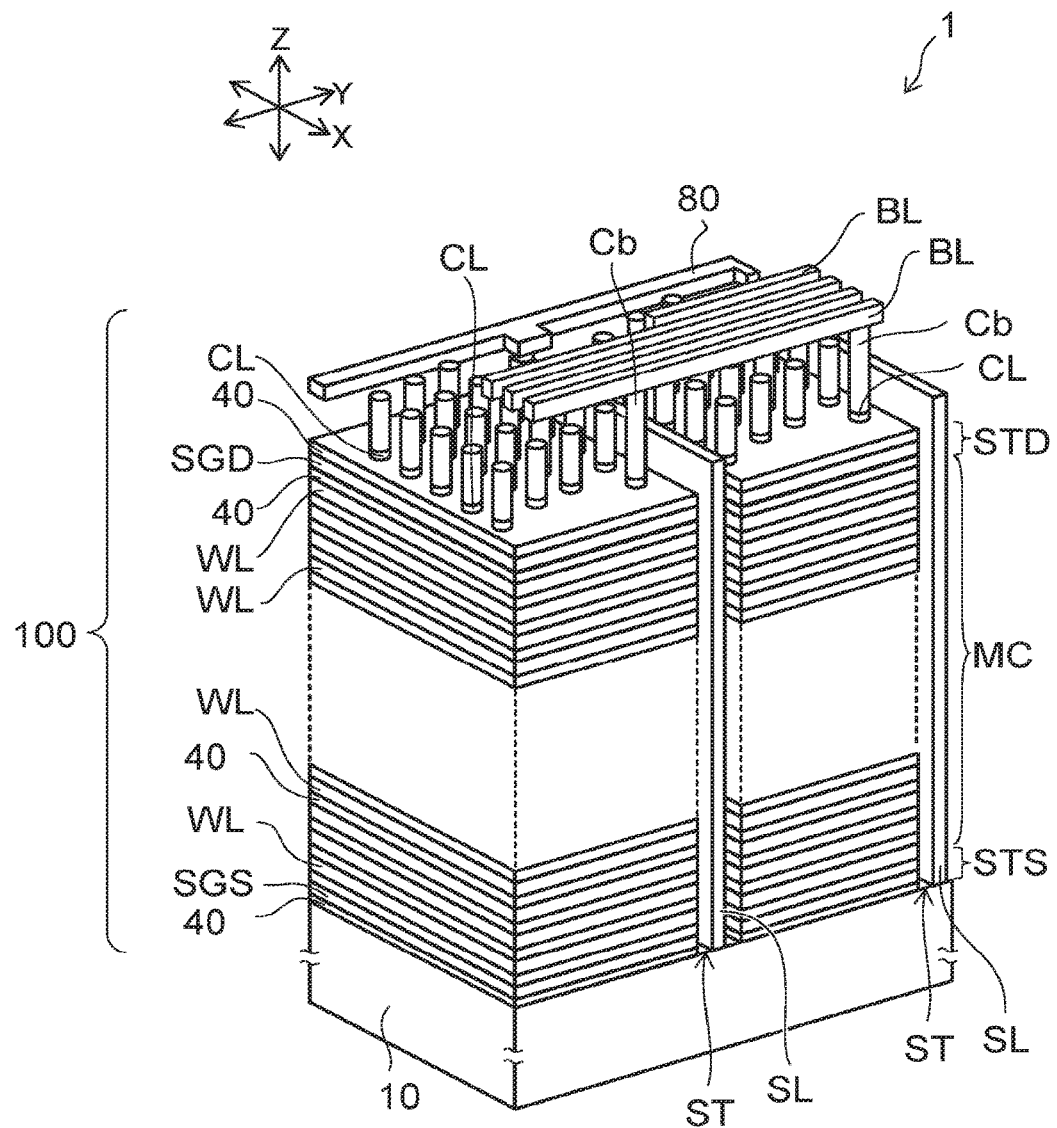
FIG. 1 is a schematic perspective view of a memory cell array of the first embodiment.

According to the embodiment, a semiconductor device includes: a substrate; a stacked body provided on the substrate and including a plurality of electrode layers stacked with an insulator interposed; a semiconductor pillar provided on the substrate and in the stacked body; a semiconductor body provided in the stacked body; and an insulating film including a charge storage film provided between the plurality of electrode layers and the semiconductor body, and extending in the stacking direction. The semiconductor pillar includes a material same as the material of the substrate. The semiconductor body includes a first portion and a second portion. The first portion is surrounded with the plurality of electrode layers and extends in a stacking direction of the stacked body. The second portion is in contact with an upper surface of the semiconductor pillar. A side surface of the second portion is provided on the upper surface of the semiconductor pillar. The insulating film further includes a portion separated from the semiconductor pillar via the second portion.

Embodiments will now be described with reference to the drawings. In the respective drawings, like members are labeled with like reference numerals. Semiconductor devices of the embodiments are semiconductor memory devices having memory cell arrays.

First Embodiment

FIG. 1 is a schematic perspective view of a memory cell array 1 of the first embodiment. In FIG. 1, two mutually-orthogonal directions parallel to a major surface of a substrate are taken as an X-direction and a Y-direction. The XY plane is taken to be a planar direction of a stacked body 100. A direction orthogonal to both the X-direction and the Y-direction is taken as a Z-direction (the stacking direction of the stacked body 100).

As shown in FIG. 1, the semiconductor device of the first embodiment includes the memory cell array 1. The memory cell array 1 is, for example, provided on the major surface of the substrate 10. The substrate 10 is, for example, a semiconductor substrate. The semiconductor substrate includes, for example, silicon. A conductivity type of the substrate 10 is, for example, p-type.

The memory cell array 1 includes the stacked body 100, a plurality of columnar portions CL, and a plurality of slits ST. The stacked body 100 is provided on the major surface of the substrate 10. The stacked body 100 includes a plurality of electrode layers (SGD, WL, SGS) and a plurality of insulators 40. The plurality of electrode layers (SGD, WL, SGS) is stacked with the insulators 40 interposed. The electrode layer (SGD, WL, SGS) includes a conductive material. The conductive material includes, for example, tungsten. The insulator 40 may be insulating material being silicon oxide and so on, and may include air gap. The number of stacks of electrode layers (SGD, WL, SGS) is arbitrary.

The electrode layer SGS is a source-side select gate. The electrode layer SGD is drain-side select gate. The electrode layer WL is a word line. The source-side select gate SGS is provided on the major surface of the substrate 10 via the insulator 40. A plurality of word lines WL is provided on the source-side select gate SGS via the insulator 40. The drain-side select gate SGD is provided on a top layer of the word lines WL via the insulator 40.

At least one of the drain-side select gates SGD is used as a gate electrode of a drain-side select transistor STD. At least one of the source-side select gates SGS is used as a gate electrode of a source-side select transistor STS. A plurality of memory cells MC is connected in series between the drain-side select transistor STD and the source-side select transistor STS. One of the word lines WL is used as a gate electrode of the memory cell MC.

The slit ST is provided in the stacked body 100. The slit ST extends along the stacking direction of the stacked body 100 (Z-direction) and a major surface of the substrate 100 direction (X-direction) in the stacked body 100. The slit ST separates the stacked body 100 into a plurality of regions in the Y-direction. The regions separated by the slit ST are called "block".

A source line SL is provided in the slit ST. The source line SL includes, for example, at least one of tungsten or titanium. The source line SL may include, for example, a stacked body being titanium and titanium nitride. The source line SL is electrically connected to the substrate 10. An insulating film is provided between the source line SL and the stacked body 100. Thereby, the source line SL is separated from the stacked body 100.

An upper layer interconnect 80 is disposed above the source line SL. The upper layer interconnect 80 extends in the Y-direction. The upper layer interconnect 80 is electrically connected to the plurality of source layers SL arranged along the Y-direction. The upper layer interconnect 80 is electrically connected to a peripheral circuit not shown.

The columnar portion CL is provided in the stacked body 100 separated by the slit ST. The columnar portion CL extends in the stacking direction of the stacked body 100 (Z-direction). The columnar portion CL is, for example, formed in a circular columnar configuration or an elliptical columnar configuration. The columnar portions CL are disposed, for example, in a staggered lattice configuration or a square lattice configuration in the memory cell array 1. The drain-side select transistor STD, the source-side select transistor STS, and the memory cell MC are disposed at the columnar portion CL.

A plurality of bit lines BL is provided above the columnar portion CL. The plurality of bit lines BL extends in the Y-direction. An upper end portion of the columnar portion CL is electrically connected to one of the bit lines BL via a contact portion Cb. One bit line BL is electrically connected to the columnar portion CL selected from the each block one by one. A lower end portion of the columnar portion CL is electrically connected to the source line SL via the substrate 10.

Figure 2:
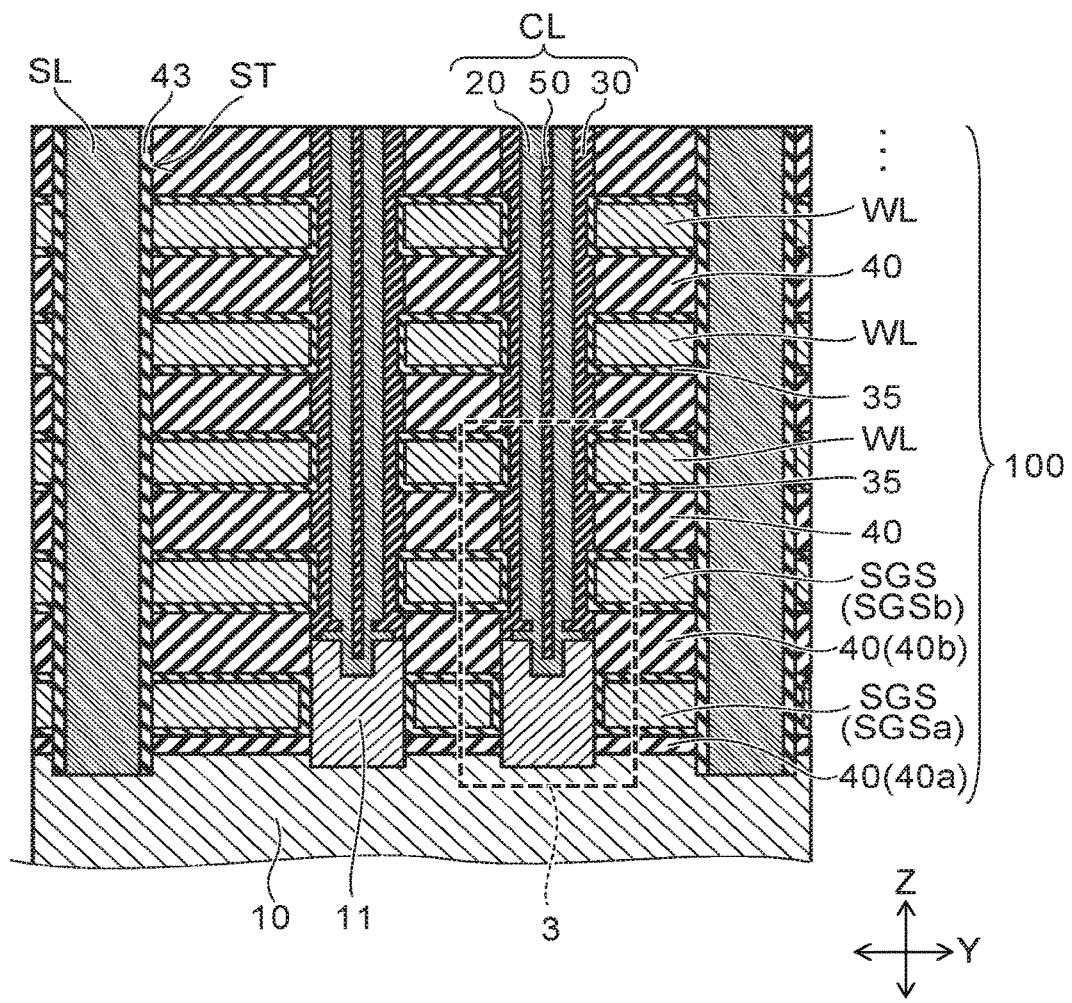
FIG. 2 is a schematic cross-sectional view of the semiconductor device of the first embodiment.

FIG. 2 is a schematic cross-sectional view of the semiconductor device of the first embodiment. FIG. 2 shows a portion of the substrate 10 side of the stacked body 100.

As shown in FIG. 2, a semiconductor pillar 11 is provided in the stacked body 100. The semiconductor pillar 11 is provided on the substrate 10, and in contact with the substrate 10. The semiconductor pillar 11 includes, for example, silicon. The semiconductor pillar 11 is, for example, formed on an upper surface of the substrate 10 by epitaxial growth process, and has a crystal structure being equal or close to a crystal structure of the substrate 10. Therefore, the semiconductor pillar 11 may be regarded as a portion of the substrate 10.

In the first embodiment, the source-side select gate SGS includes a first source-side select gate SGSa and a second source-side select gate SGSb. The first source-side select gate SGSa is provided on the substrate 10 via an insulator 40a of the insulator 40. The second source-side select gate SGSb is provided on the first source-side select gate SGSa via an insulator 40b of the insulator 40. The semiconductor pillar 11 faces at least one of the electrode layers (SGD, WL, SGS). In the first embodiment, the semiconductor pillar 11 faces, for example, the first source-side select gate SGSa.

The columnar portion CL includes a memory film 30, a semiconductor body 20, and a core layer 50. The memory film 30, the semiconductor body 20 and the core layer 50 extend along the stacking direction of the stacked body 100 (Z-direction). The memory film 30 is provided in contact with the stacked body 100. A configuration of the memory film 30 is, for example, a tubular configuration. The semiconductor body 20 is provided on the memory film 30. The semiconductor body 20 includes, for example, silicon. The silicon is, for example, polysilicon made of amorphous silicon that is crystallized. The semiconductor body 20 is in contact with the semiconductor pillar 11, and electrically connected to the substrate 10. The core layer 50 is provided on the semiconductor body 20. The core layer 50 has insulation. The core layer 50 includes, for example, silicon oxide. A configuration of the core layer 50 is, for example, a columnar configuration.

Figure 3:
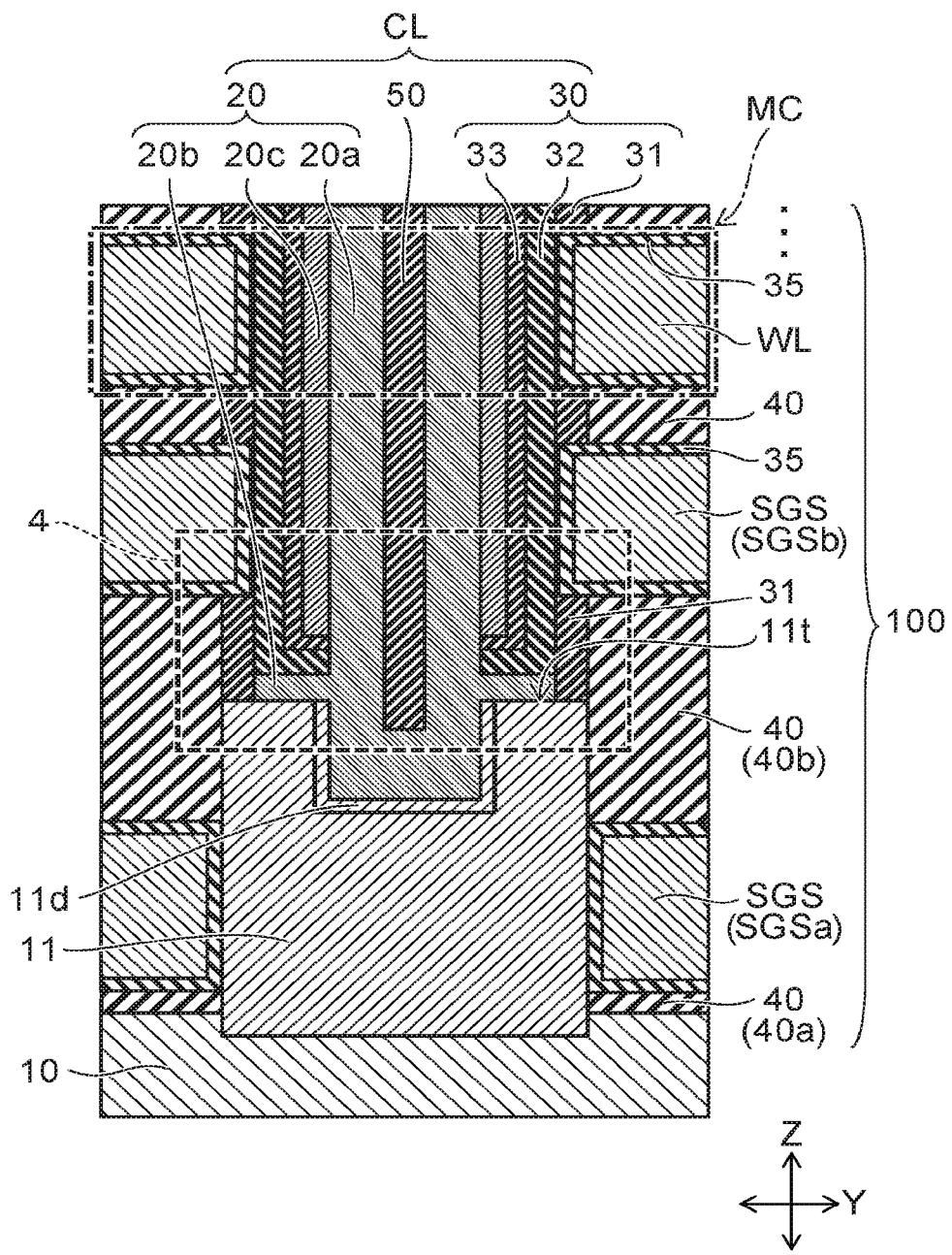
FIG. 3 is an enlarge schematic cross-sectional view of a broken line frame 3 in FIG. 2.

FIG. 3 is a schematic cross-sectional view of the semiconductor device of the first embodiment. FIG. 3 is an enlarge schematic cross-sectional view of a broken line frame 3 in FIG. 2.

As shown in FIG. 3, the memory film 30 includes a cover insulating film 31, a charge storage film 32, and a tunneling insulating film 33. The cover insulating film 31 is provided between the semiconductor body 20 and the insulator 40. A lower surface of the cover insulating film 31 is in contact with an upper surface lit of the semiconductor pillar 11. Outside of a side surface of the cover insulating film 31 is coplanar with a side surface of the semiconductor pillar 11. The cover insulating film 31 includes, for example, silicon oxide similar to a material of the insulator 40. For example, in the process forming the word line (SGD, WL, SGS), the cover insulating film 31 protects the charge storage film 32 from etching.

The charge storage film 32 is provided between the electrode layer (SGD, WL, SGS) and the semiconductor body 20, and between the cover insulating film 31 and the semiconductor body 20. In a portion shown in FIG. 3, the charge storage film 32 is provided between the second source-side select gate SGSb and the semiconductor body 20, between the word line WL and the semiconductor body 20, and between the cover insulating film 31 and the semiconductor body 20. The charge storage film 32 is separated from the semiconductor pillar 11. The charge storage film 32 includes, for example, a silicon nitride. The charge storage film 32 may include a hafnium oxide other than the silicon nitride. The charge storage film 32 includes a trap site trapping a charge in the film. The charge is trapped in the trap site. A threshold value of the memory cell MC changes depending on presence or absence of the charge trapped at the trap site and the amount of trapped charge. Thereby, the memory cell MC holds information.

The tunneling insulating film 33 is provided between the semiconductor body 20 and the charge storage film 32. A lower surface of the tunneling insulating film 33 is in contact with the charge storage film 32. The tunneling insulating film 33 includes, for example, a silicon oxide or a stacked body formed of a silicon oxide and a silicon nitride. The tunneling insulating film 33 is a potential barrier between the charge storage film 32 and the semiconductor body 20. When a charge is injected from the semiconductor body 20 into the charge storage film 32 (writing operation) and a charge is emitted from the charge storage film 32 to the semiconductor body 20 (erasing operation), the charge tunnels through the tunneling insulating film 33.

The stacked body 100 includes a blocking insulating film 35. The blocking insulating film 35 is provided between the electrode layer (SGD, WL, SGS) and the insulator 40, and between the electrode layer (SGD, WL, SGS) and the memory film 30. In a portion shown in FIG. 3, the blocking insulating film 35 is provided each of portions detailed below.

(1) between the first source-side select gate SGSa and the insulator 40a (2) between the first source-side select gate SGSa and the insulator 40b (3) between the first source-side select gate SGSa and the semiconductor pillar 11

(4) between the second source-side select gate SGSb and the insulator 40b (5) between the second source-side select gate SGSb and the insulator 40

(6) between the second source-side select gate SGSb and the charge storage film 32

(7) between the word line WL and the insulator 40

(8) between the word line WL and the charge storage film 32

The blocking insulating film 35 includes, for example, silicon oxide, or silicon oxide and aluminum oxide. The blocking insulating film 35 suppresses, for example, back-tunneling of the charge from the word line WL into the charge storage film 32 in the erasing operation. Else, in the first embodiment, the blocking insulating film 35 is also used as gate insulating film of the first source-side select gate SGSa. Further, although not illustrated in FIG. 3, for example, the barrier film may be provided between the blocking insulating film 35 and the electrode layer (SGD, WL, SGS). The barrier film includes, for example, titanium nitride, or titanium and titanium nitride.

The semiconductor body 20 is provided on the semiconductor pillar 11. The semiconductor body 20 includes a channel portion 20a (first portion), a connection portion 20b (second portion), and a cover portion 20c (third portion).

The channel portion 20a is surrounded with the electrode layer (SGD, WL, SGS). The channel portion 20a extends from a portion surrounded with the electrode layer (SGD, WL, SGS) to a portion surrounded with the semiconductor pillar 11 in the Z-direction. A configuration of the channel portion 20a is, for example, a circular cylinder configuration having a bottom.

The connection portion 20b is provided between the semiconductor pillar 11 and the charge storage film 32. The connection portion 20b is in contact with the upper surface 11t of the semiconductor pillar 11. The connection portion 20b is electrically connected to the substrate 10 via the semiconductor pillar 11. An upper surface of the connection portion 20b is in contact with a lower surface of the charge storage film 32. A side surface of the connection portion 20b is provided on the upper surface 11t of the semiconductor pillar 11. The side surface of the connection portion 20b is in contact with a lower end of the cover insulating film 31, and separated from the insulator 40. A height of the upper surface 11t of the semiconductor pillar 11 and a height of the connection portion 20b are located in the middle of the insulator 40b. Here, "height" indicates the height of the Z-direction.

The cover portion 20c is provided between the channel portion 20a and the tunneling insulating film 33. In the process forming the columnar portion CL, the cover portion 20c protects the memory film 30.

The semiconductor pillar 11 includes a damage portion 11d provided between the semiconductor pillar 11 and the channel portion 20a. For example, in the process working the semiconductor pillar 11, the damage portion 11d is a portion where the surface of the semiconductor pillar 11 is deteriorated. The damage portion 11d includes a crystal defect such as impurities of carbon and so on, and misfit dislocation. Thus, for example, when supplying electrons from the substrate 10 to the channel portion 20a, it tends electrons are trapped at the damage portion 11d. When the electrons are trapped at the damage portion 11d, a parasitic resistance in the semiconductor pillar 11 is increased.

In contrast, the first embodiment, as a portion in contact with the semiconductor pillar 11, the connection portion 20b is provided in addition to the channel portion 20a. The connection portion 20b is in contact with the upper surface 11t of the semiconductor pillar 11. The upper surface 11t does not include most of the damage portion 11d. Thus, in the first embodiment, electrons may be supplied from the substrate 10 to the semiconductor body 20, via the upper surface 11t of the semiconductor pillar 11 not including most of the damage portion 11d. Therefore, the increasing of the parasitic resistance in the semiconductor pillar 11 may be suppressed as compared with the case a portion where the semiconductor body 20 is in contact with the semiconductor pillar 11 is only the channel portion 20a in contact with the damage portion 11d.

Figure 4:
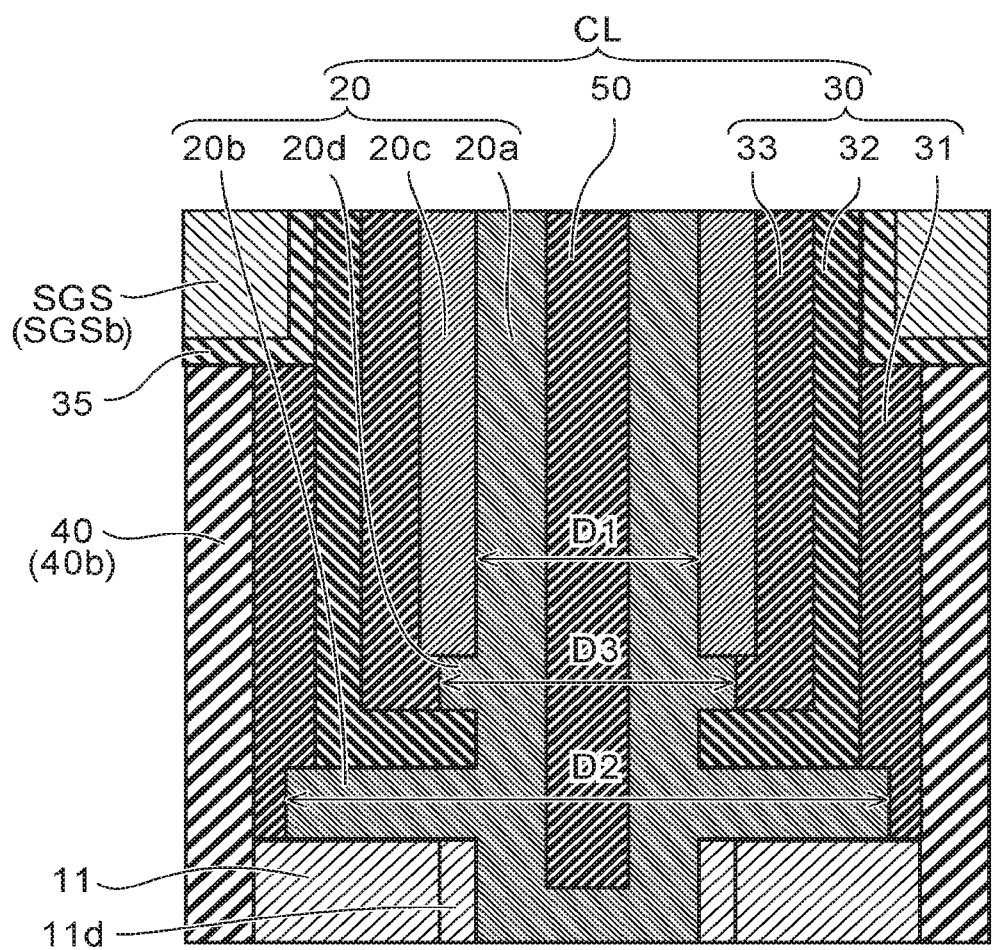
FIG. 4 is an enlarge schematic cross-sectional view of a broken line frame 4 in FIG. 3.

FIG. 4 is a schematic cross-sectional view of the semiconductor device of the first embodiment. FIG. 4 is an enlarge schematic cross-sectional view of a broken line frame 4 in FIG. 3.

As shown in FIG. 4, the semiconductor body 20 further includes a protrusion portion 20d (fourth portion). The protrusion portion 20d is provided between the cover portion 20c and the charge storage film 32, along the Z-direction. The charge storage film 32 is provided between the protrusion portion 20d and the connection portion 20b. As viewed in the Z-direction, a maximum diameter D2 of the connection portion 20b is larger than a maximum diameter D3 of the protrusion portion 20d, and is larger than a maximum diameter D1 of the channel portion 20a. By providing larger maximum diameter D2 of the connection portion 20b, the area of the connection portion 20b in contact with the semiconductor pillar 11 is increased. Thereby, a contact resistance between the connection portion 20b and the semiconductor pillar 11 may be reduced.

Next, one example of a method for manufacturing the semiconductor device of the embodiment will be described.

FIG. 5A to FIG. 9B are schematic cross-sectional views showing a method for manufacturing the semiconductor device of the first embodiment. The cross-sections shown in FIG. 5B to FIG. 7B, and FIG. 8B correspond to the cross-section shown in FIG. 3. The cross-section shown in FIG. 8A corresponds to the cross-section shown in FIG. 4.

Figure 5A:
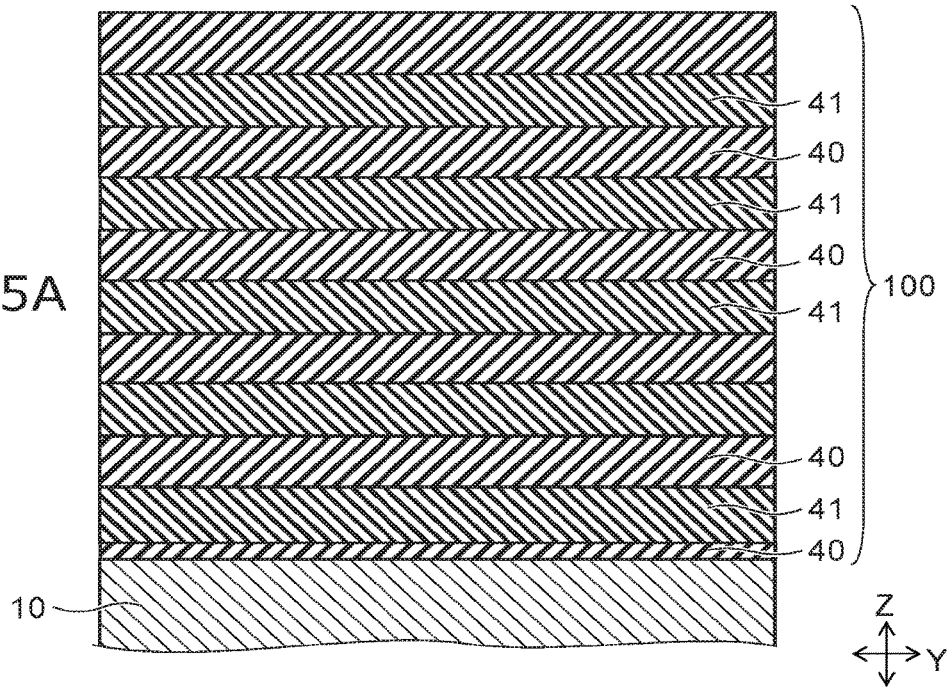

As shown in FIG. 5A, the stacked body 100 is formed on the substrate 10. The stacked body 100 is in a state where the replacement members 41 (first layers) and the insulators 40 are alternately stacked. The replacement member 41 is a member to be replaced by the electrode layers (SGD, WL, SGS) later. The material of the replacement member 41 is selected from materials that can take an etching selection ratio to the insulator 40. For example, when a silicon oxide is selected as the insulator 40, a silicon nitride is selected as the replacement member 41.

Figure 5B:
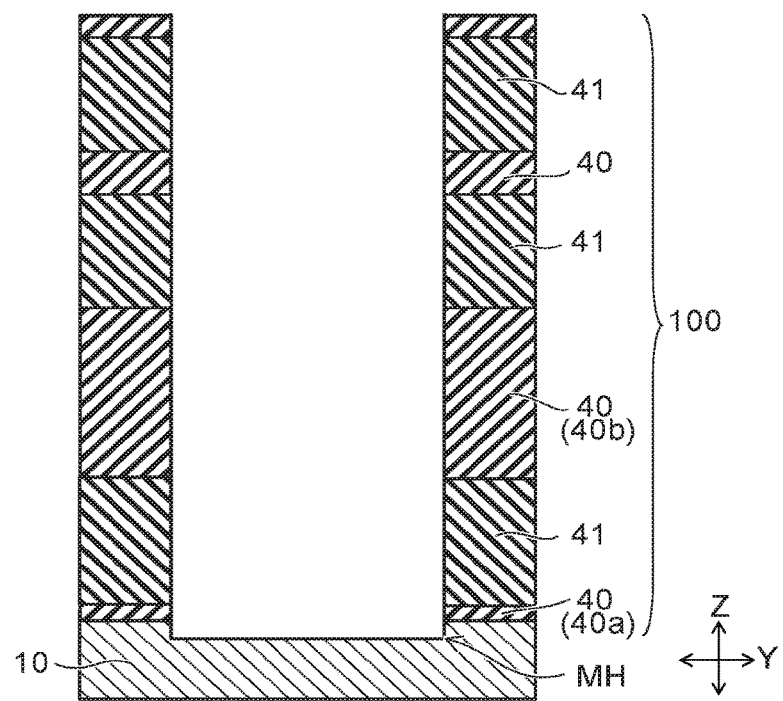

Next, as shown in FIG. 5B, a memory hole MH is formed in the stacked body 100. The memory hole MH pierces the stacked body 100 and reaches the substrate 10. The replacement member 41, the insulator 40, and the substrate 10 are exposed from a side wall of the memory hole MH, and the substrate 10 is exposed from a bottom surface of the memory hole MH.

Figure 6A:
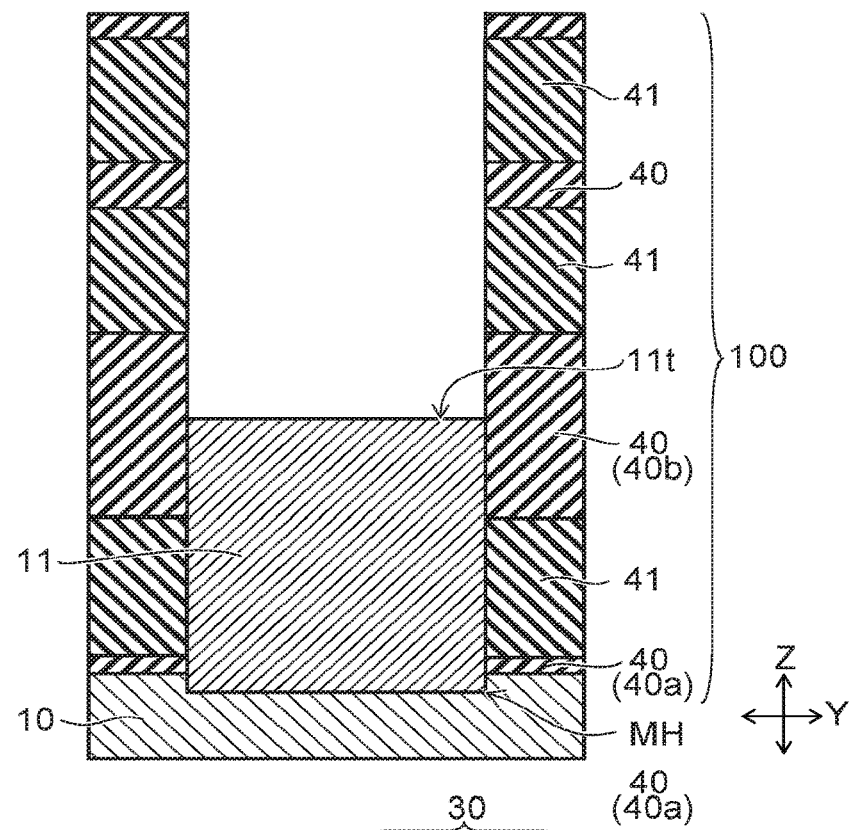

Next, as shown in FIG. 6A, the semiconductor pillar 11 is formed in the memory hole MH. The semiconductor pillar 11 is formed continued from the upper surface of the substrate 10 to a middle portion of the insulator 40b, the upper surface of the substrate 10 is exposed from the memory hole MH. The semiconductor pillar 11 is, for example, formed by epitaxial growth method by using the substrate 10 as nucleus. Thereby, the semiconductor pillar 11 has the crystal structure being equal or close to the crystal structure of the substrate 10. For example, the semiconductor pillar 11 has single crystalline structure. Before performing epitaxial growth method, for example, the surface of the substrate 10 may be performed etching. By etching the surface of the substrate 10 before epitaxial growth, the damage portion and so on formed on the surface of the substrate 10 may be removed, and the crystal structure of the semiconductor pillar 11 may be further close to the crystal structure of the substrate 10.

Figure 6B:
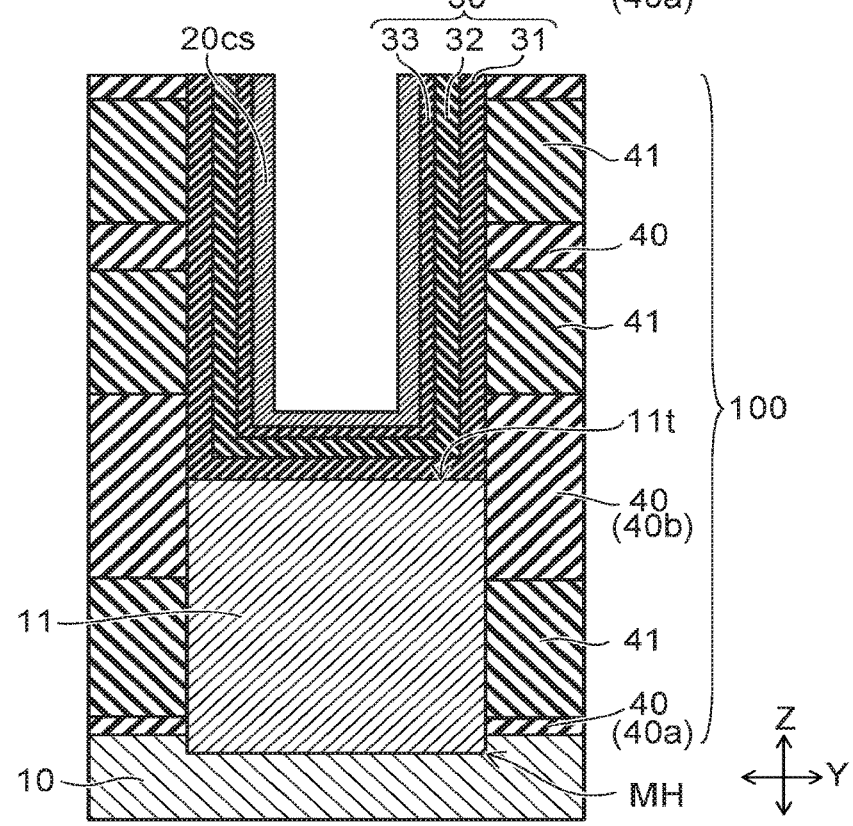

Next, as shown in FIG. 6B, the memory film 30 is formed on an inner wall of the memory hole MH and the upper surface 11t of the semiconductor pillar 11. The memory film 30 is formed by forming the cover insulating film 31 on a side wall of the memory hole MH and the upper surface 11t of the semiconductor pillar 11, forming the charge storage film 32 on the cover insulating film 31, and forming the tunneling insulating film 33 on the charge storage film 32. After that, the cover portion 20cs is formed on the tunneling insulating film 33. The cover insulating film 31, the charge storage film 32, the tunneling insulating film 33, and the cover portion 20cs are, for example, formed using CVD (chemical vapor deposition).

A material of the charge storage film 32 is, for example, selected from materials that can take an etching selection ratio to the cover insulating film 31. For example, when a silicon oxide is selected as the cover insulating film 31, a silicon nitride is selected as the charge storage film 32. For example, a silicon oxide having a composition different from the silicon oxide of the cover insulating film 31 is selected as the tunneling insulating film 33, and an etching rate of the tunneling insulating film 33 is smaller than an etching rate of the cover insulating film 31. The cover portion 20cs is, for example, a non-crystalline film of a silicon-based, such as amorphous silicon.

Figure 7A:
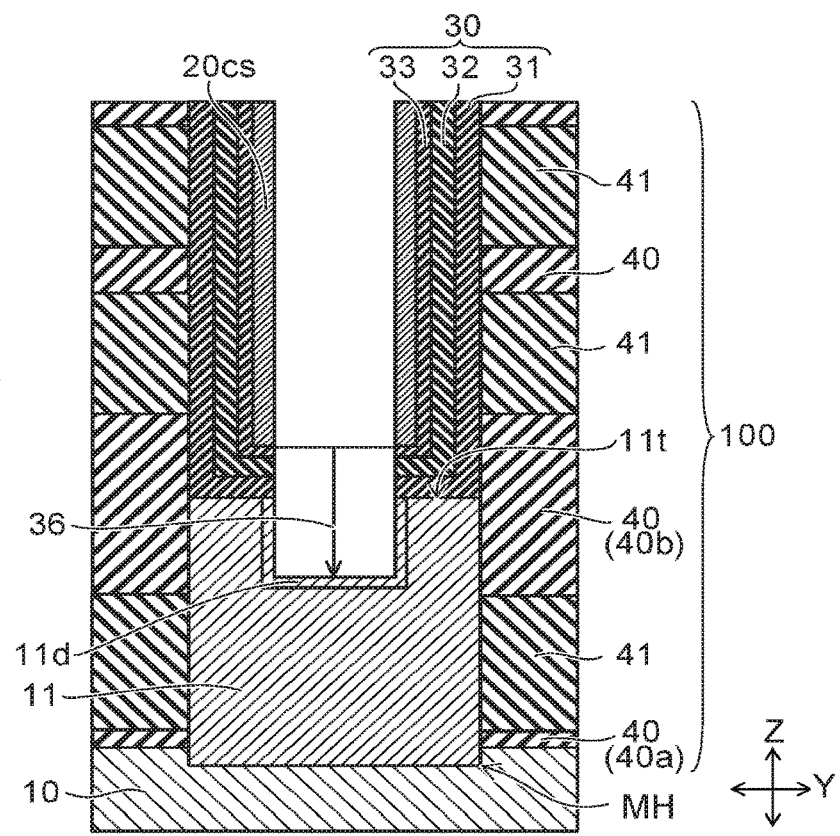

Next, as shown in FIG. 7A, a portion of the cover portion 20cs, a portion of the memory film 30, and a portion of the semiconductor pillar 11 are removed, and a recess portion 36 is formed. The arrow in the figure shows the recess portion 36. The recess portion 36 is, for example, formed by performing an isotropic etching from a bottom portion of the cover portion 20cs to inside of the semiconductor pillar 11. In this etching, for example, RIE (Reactive Ion Etching) method using a fluorocarbon based gas is performed. At this time, the damage portion 11d is formed at the surface of the semiconductor pillar 11 exposed from the recess portion 36. The damage portion 11d includes, for example, impurities of carbon and so on.

Figure 7B:
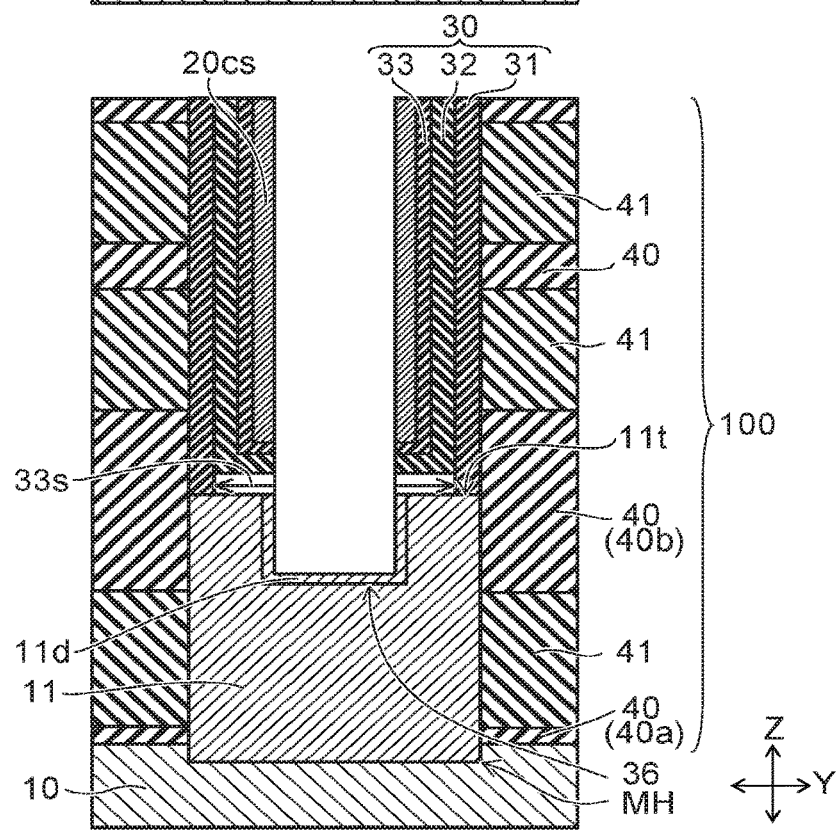

Next, as shown in FIG. 7B, by recessing a side surface of the cover insulating film 31 exposed from the recess portion 36, the recess portion 33s is formed. The arrow in the figure shows the recess portion 33s. Thereby, the upper surface 11t of the semiconductor pillar 11, a lower surface of the charge storage film 32, and a side surface of the cover insulating film are exposed from the recess portion 33s. The recess portion 33s is, for example, formed by performing isotropic etching of high etching rate condition with respect to the semiconductor pillar 11. For example, dry etching using ammonia gas and nitrogen trifluoride gas, and wet etching using a solution including hydrogen fluoride or sulfuric acid is used as the isotropic etching. In this case of using the isotropic etching, damage portion does not generated in the upper surface 11t of the semiconductor pillar 11 exposed from the recess portion 33s.

The isotropic etching is performed until at least the upper surface 11t of the semiconductor pillar 11 not including the damage portion 11d is exposed from the recess portion 33s. Thereby, the semiconductor body 20s may be formed in contact with the upper surface 11t of the semiconductor pillar 11 not including the damage portion 11d. Further, the isotropic etching is, for example, terminated before exposing the insulator 40b from the recess portion 33s. Thereby, the forming of the semiconductor body 20s spreading further outside than the semiconductor pillar 11 may be suppressed.

Figure 8A:
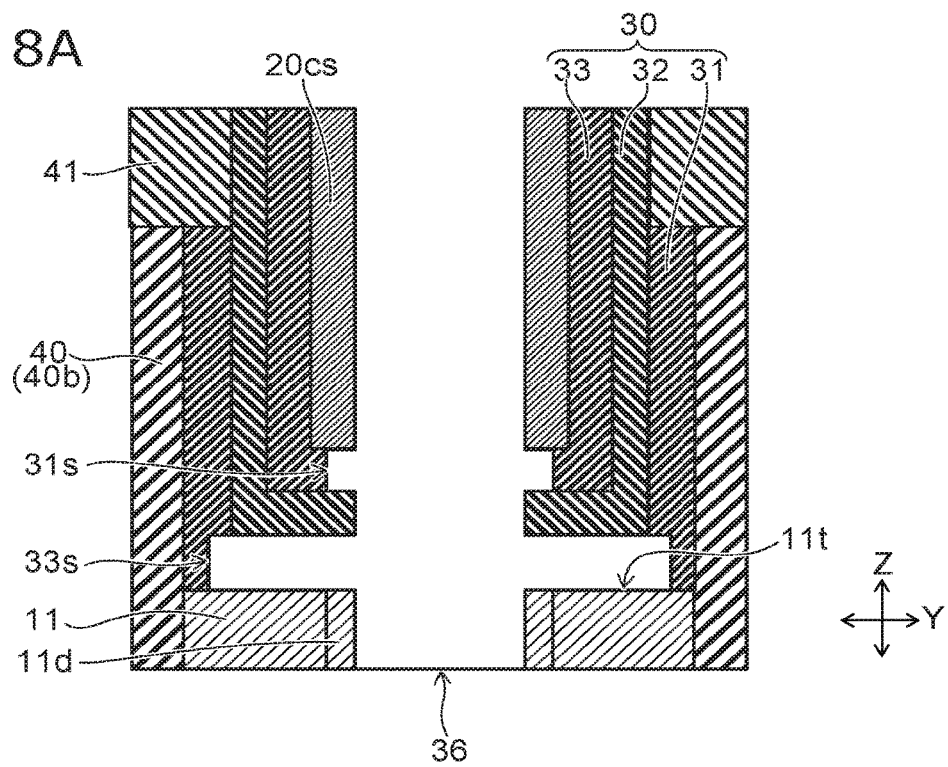

Further, for example, as shown in FIG. 8A, by simultaneously recessing the side surface of the cover insulating film 31 with the tunneling insulating film 33, the recess portion 31s may be formed. In this case, because the etching rate of the tunneling insulating film 33 is smaller than the etching rate of the cover insulating film 31, a volume of the recess portion 31s is smaller than a volume of the recess portion 33s.

Figure 8B:
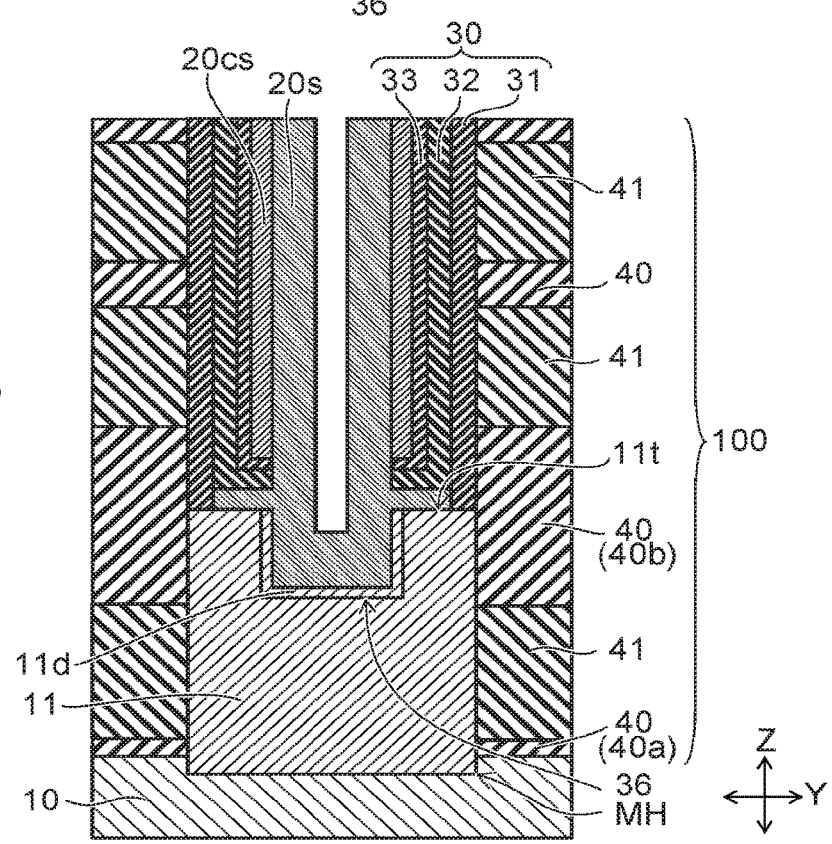

Next, as shown in FIG. 8B, the semiconductor body 20s is formed in the recess portions 36, 33s, 31s, and a side surface of the cover portion 20cs. The semiconductor body 20s is, for example, a non-crystalline material of a silicon-based, such as amorphous silicon. After that, the semiconductor body 20s and the cover portion 20cs are annealed (crystallization annealing). Thereby, as shown in FIG. 3 and FIG. 4, the semiconductor body 20 crystallized is formed. The semiconductor body 20 includes the channel portion 20a, the connection portion 20b, the cover portion 20c, and the protrusion portion 20d.

When the semiconductor body 20s is crystallized, for example, in a portion in contact with the semiconductor pillar 11, by solid phase growing from the semiconductor pillar 11 as a base, the crystal structure of the semiconductor pillar 11 having less damage (for example crystal defect) is inherited. In contrast, in a portion in contact with the damage portion 11d of the semiconductor pillar 11, an effect of the crystal defect of the semiconductor pillar 11 is inherited, and it is likely to grow. Thus, in the case the semiconductor pillar 11 is single crystalline, a region of the semiconductor body 20 single-crystallized may be as large as a large area of the semiconductor body 20 in contact with the semiconductor pillar 11. Thereby, a resistance in the semiconductor body 20 may be decreased.

In this regard, in the first embodiment, the connection portion 20b in contact with the semiconductor pillar 11 is formed in addition to the channel portion 20a in contact with the damage portion 11d. Thus, the region inherited the crystal structure of the semiconductor pillar 11 is increased as compared with the case the channel portion 20a is only formed. Thereby, the resistance in the semiconductor body 20 may be decreased.

Next, as shown in FIG. 9A, the core layer 50 is formed on the semiconductor body 20. The core layer 50 includes, for example, silicon oxide. The core layer 50 may be, for example, formed before crystallizing the semiconductor body 20. After that, the slit ST piercing the stacked body 100 and reaching the substrate 10 is formed. The slit ST extends in the X-direction. The replacement member 41 and the insulator 40 are exposed in a side wall of the slit ST.

Next, as shown in FIG. 9B, the replacement member 41 is removed from the stacked body 100 via the slit ST. Thereby, the space 41s is formed. For example, the insulator 40 and the memory film 30 are exposed in the space 41s.

Next, as shown in FIG. 1 and FIG. 2, the blocking insulating film 35 and the electrode layer (SGD, WL, SGS) are formed via the slit ST. After that, the bit line BL and so on are formed on the stacked body 100.

The semiconductor device of the first embodiment may be, for example, manufactured by the method for manufacturing above described.

Second Embodiment

Figure 10:
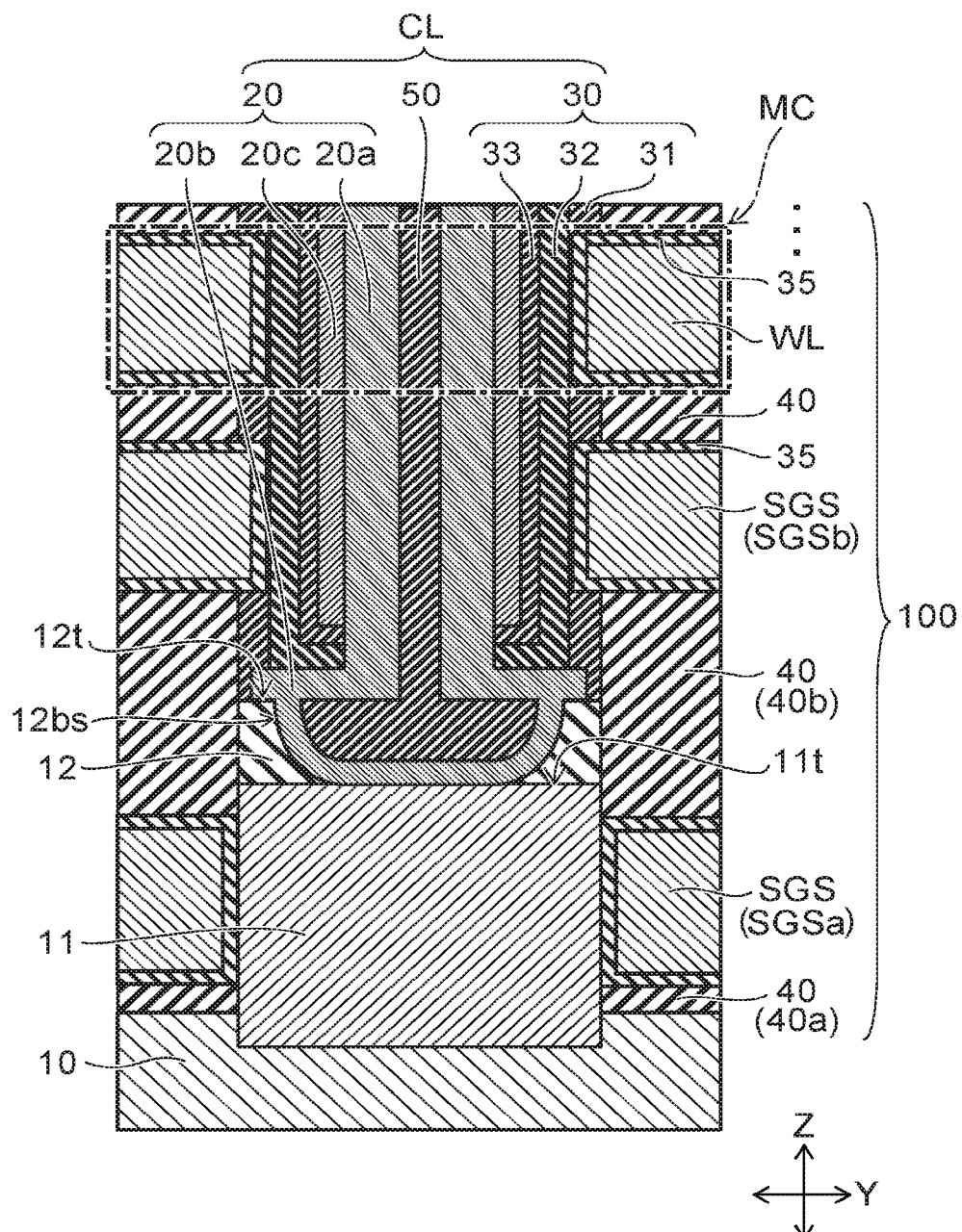
FIG. 10 is a schematic cross-sectional view of the semiconductor device of a second embodiment.

FIG. 10 is a schematic cross-sectional view of the semiconductor device of a second embodiment. The cross-sectional view shown in FIG. 10 corresponds to the cross-sectional view shown in FIG. 3.

As shown in FIG. 10, the semiconductor device of the second embodiment is different from the semiconductor device of the first embodiment in that an insulating film 12 is provided on the semiconductor pillar 11, the channel portion 20a is not provided in the semiconductor pillar 11, and the damage portion 11d does not exist in the semiconductor pillar 11.

As shown in FIG. 10, the insulating film 12 is in contact with the upper surface 11t of the semiconductor pillar 11 and the side surface of the connection portion 20b. A height of the upper surface 12t of the insulating film 12 is located in the middle of the insulator 40b, and the upper surface 12t of the insulating film 12 is surrounded with the insulator 40b. The side surface of the connection portion 20b provided on an upper surface 12t of the insulating film 12 is provided further the insulator 40b side than a side surface 12bs of the insulating film 12. The insulating film 12 includes, for example, silicon oxide. Outside of a side surface of the insulating film 12 is in contact with the insulator 40b, and is coplanar with the side surface of the semiconductor pillar 11.

Also in the second embodiment, the upper surface 11t of the semiconductor pillar 11 is in contact with the connection portion 20b, and the damage portion 11d does not exist between the upper surface 11t of the semiconductor pillar 11 and the connection portion 20b. Thereby, the increasing of the parasitic resistance in the semiconductor pillar 11 may be suppressed. Further, in the second embodiment, the channel portion 20a is not provided in the semiconductor pillar 11. Thus, the area of the connection portion 20b in contact with the semiconductor pillar 11 may be increased as compared with the structure that the channel portion 20a is provided in the semiconductor pillar 11. Thereby, the contact resistance between the connection portion 20b and the semiconductor pillar 11 may be reduced.

Next, the method for manufacturing of the semiconductor device of the second embodiment is described.

FIG. 11A to FIG. 13 are schematic cross-sectional views showing a method for manufacturing the semiconductor device of the second embodiment.

Figure 11A:
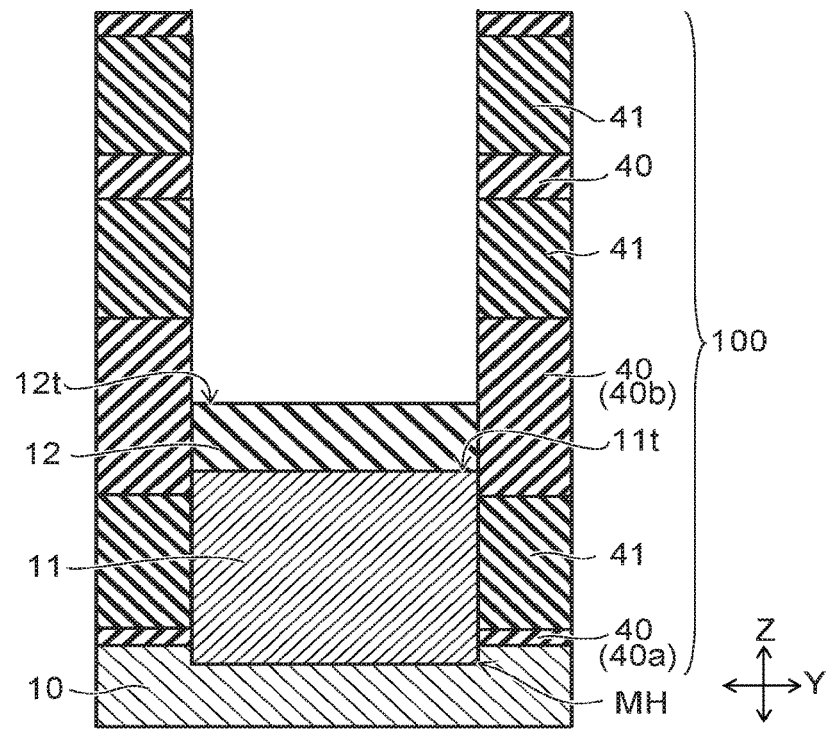
FIG. 11A to FIG. 13 are schematic cross-sectional views showing a method for manufacturing the semiconductor device of the second embodiment.

For example, according to the method for manufacturing described with reference to FIG. 5A to FIG. 6A, a structure of the semiconductor pillar 11 shown in FIG. 11A is achieved. In FIG. 11A, the insulating film 12 is formed after forming the semiconductor pillar 11. The insulating film 12 is, for example, formed by performing oxidation of an upper portion of the semiconductor pillar 11, for example, using thermal oxidation. For example, the surface of the semiconductor pillar 11 heated is exposed in oxygen atmosphere, for example, using WVG (Water Vapor Generator) device for generating steam by burning oxygen and hydrogen. Thereby, the insulating film 12 is formed by oxidizing the semiconductor pillar 11. In other words, the insulating film 12 includes silicon oxide. At this time, the height of the upper surface 11t of the semiconductor pillar 11 and the height of the upper surface 12t of the insulating film 12 are located in the middle of the insulator 40b.

Figure 11B:
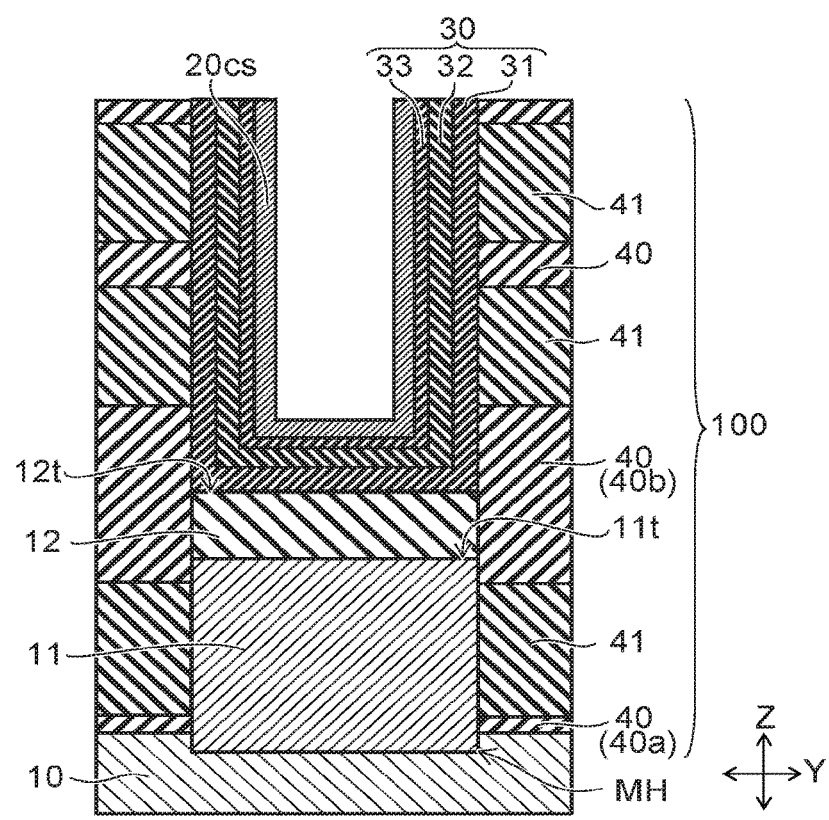

Next, as shown in FIG. 11B, by the similar process to a detail described with reference to FIG. 6B of the first embodiment, the memory film 30 is formed on the side wall of the memory hole MH and the upper surface 12t of the insulating film 12.

Figure 12A:
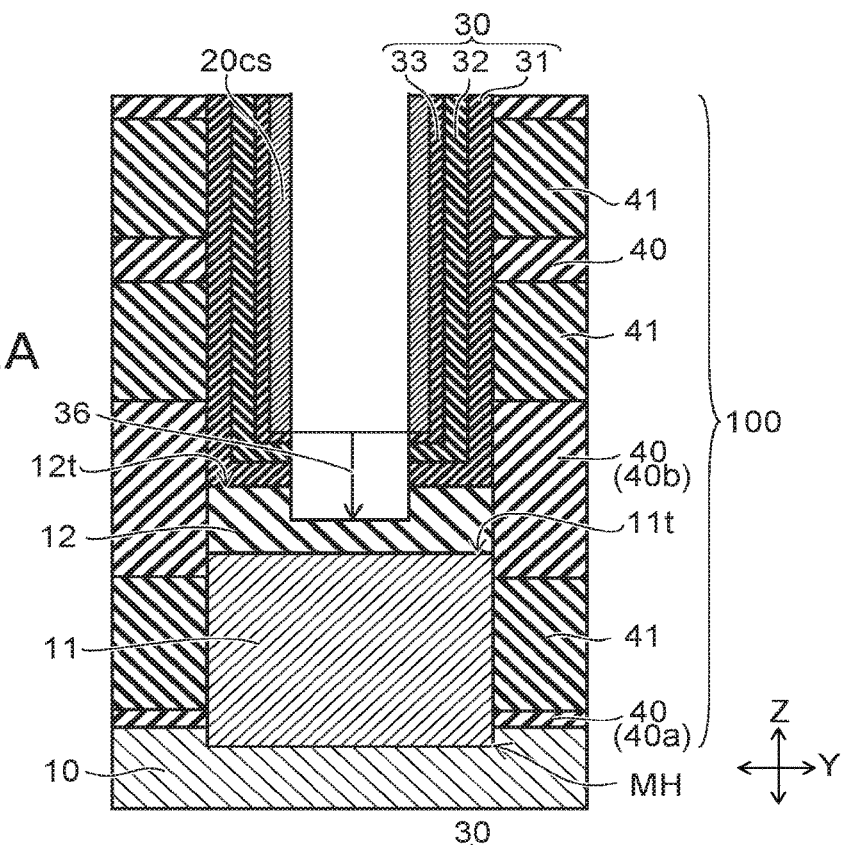

Next, as shown in FIG. 12A, the portion of the cover portion 20cs, the portion of the memory film 30, and the portion of the insulating film 12 are removed, and the recess portion 36 is formed. The arrow in the figure shows the recess portion 36. The recess portion 36 is, for example, formed by performing an isotropic etching from the bottom portion of the cover portion 20cs to inside of the insulating film 12. At this time, in the second embodiment, the portion of the semiconductor pillar 11 is not removed. Thus, unlike the first embodiment, the damage portion 11d is not generated in the semiconductor pillar 11.

Figure 12B:
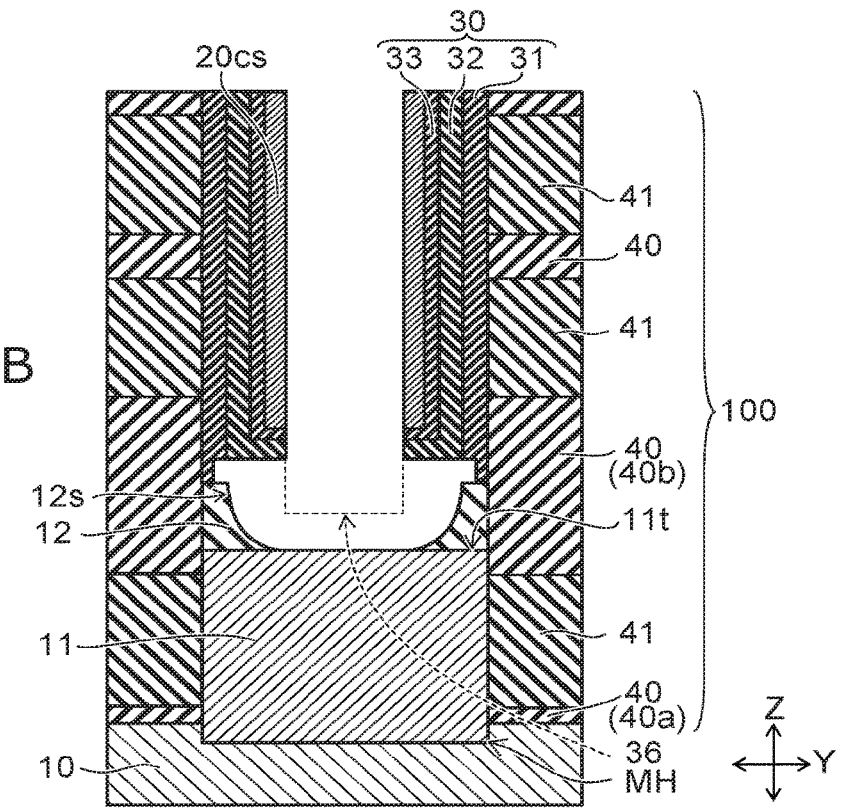

Next, as shown in FIG. 12B, the side surface of the insulating film 12 and the cover insulating film 31 exposed from the recess portion 36 is recessed, and the recess portion 12s is formed. The broken line portion of the figure is located on the surface of the recess portion 36 before recessing the insulating film 12 and the cover insulating film 31. Here, the insulating film 12 is a film formed by thermal oxidation. A density of film of the insulating film 12 formed by thermal oxidation is, for example, higher than a density of film of the cover insulating film 31 formed by CVD method. An etching rate of the insulating film 12 having high density of film is, for example, smaller than an etching rate of the cover insulating film 31. Thus, in the recess portion 12s formed, the isotropic etching of a long etching time is performed than the case of forming a recess portion 33s described in the first embodiment. By extending the etching time, it is possible to reliably retract the insulating film 12 in the Z-direction. Thereby, similar to the first embodiment, the upper surface 11t of the semiconductor pillar 11 is exposed from the recess portion 12s without generating the damage portion. The isotropic etching is performed along not only Z-direction, but also the X-direction and the Y-direction. Thus, the plane pattern of the recess portion 12s is, against the inside of the opening of the cover portion 20cs, the concentric circles. Further, the side surface of the insulating film 12 recessed has a slope shape except for the exposed surface of the semiconductor pillar 11. In addition, an amount of the cover insulating film 31 recessed is larger than an amount of the insulating film 12 recessed. A portion of the upper surface of the insulating film 12 is exposed from the recess portion 12s.

Also in the second embodiment, the isotropic etching is, for example, at least performed until the upper surface 11t of the semiconductor pillar 11 is exposed from the recess portion 12s. Further, the isotropic etching is, for example, terminated before exposing the insulator 40b from the recess portion 12s.

Further, for example, by simultaneously forming the recess portion 12s with recessing the tunneling insulating film 33, as shown in FIG. 8, the recess portion 31s may be formed.

Figure 13:
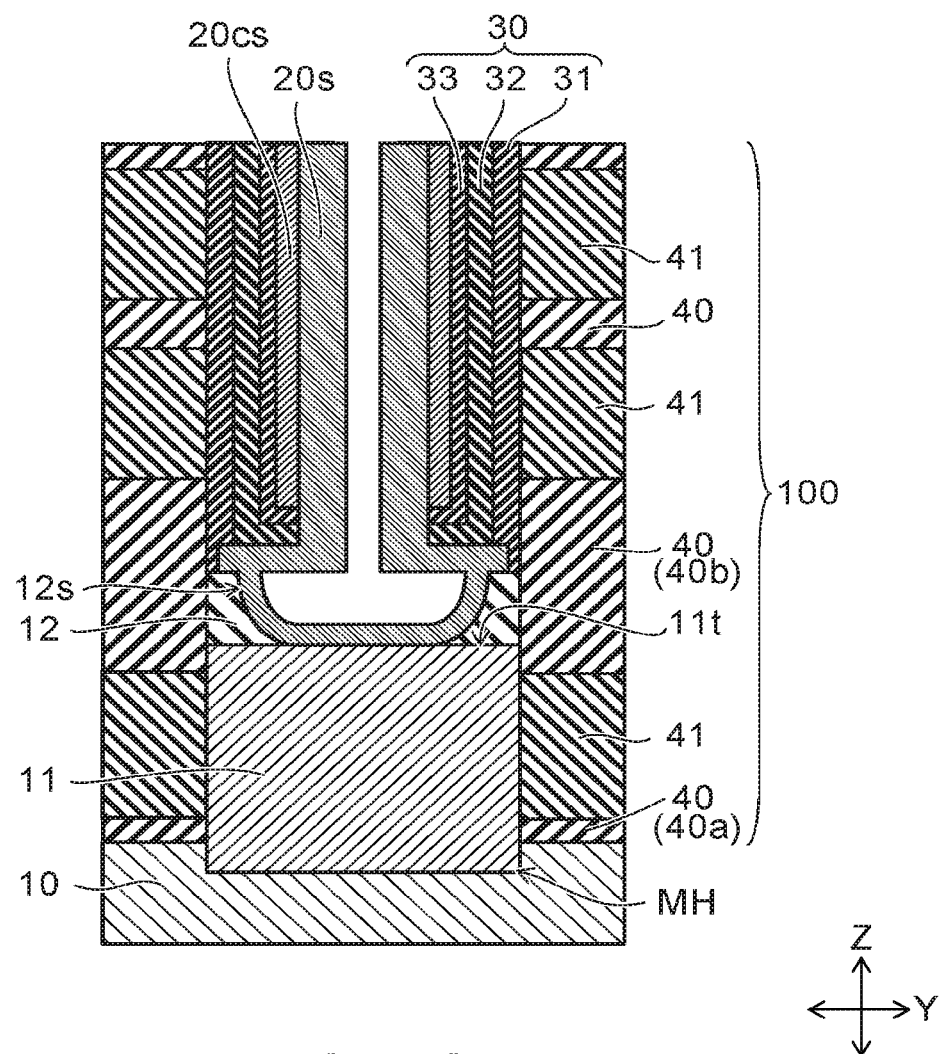

Next, as shown in FIG. 13, the semiconductor body 20s is formed in the recess portions 36, 12s, 31s and on the side surface of the cover portion 20cs. The semiconductor body 20s is, for example, a non-crystalline material of a silicon-based, such as amorphous silicon.

Next, the semiconductor body 20s and the cover portion 20cs are annealed. Thereby, as shown in FIG. 10, the semiconductor body 20 crystallized is formed. The semiconductor body 20 includes the channel portion 20a, the connection portion 20b, the cover portion 20c, and the protrusion portion 20d shown in FIG. 4.

After that, for example, by the similar process to a detail described with reference to FIG. 9A, FIG. 9B, FIG. 1, and FIG. 2, the semiconductor device of the second embodiment is formed.

In the second embodiment, the damage portion is not formed in the semiconductor pillar 11 by etching. Thus, the area of the connection portion 20b in contact with the semiconductor pillar 11 may be increased as compared with the case the damage portion is formed. Thereby, when the semiconductor body 20 is crystallized, the region inherited the crystal structure of the semiconductor pillar 11 is increased. Thereby, the resistance in the semiconductor body 20 may be decreased.

Thus, according to the embodiment, the increasing of the parasitic resistance in the semiconductor pillar 11 may be suppressed. Thereby, the cell current may be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a substrate;
   a stacked body provided on the substrate, the stacked body including a plurality of electrode layers stacked with an insulator interposed;
   a semiconductor pillar provided on the substrate and in the stacked body;
   a semiconductor body provided in the stacked body, the semiconductor body including a first portion and a second portion,
      the first portion surrounded with the plurality of electrode layers and extending in a stacking direction of the stacked body,
      the second portion in contact with an upper surface of the semiconductor pillar, the second portion extending in a first direction, the first direction crossing the stacking direction, a width of the second portion in the first direction being larger than a width of the first portion in the first direction; and
   an insulating film including a charge storage film provided between the plurality of electrode layers and the semiconductor body, and extending in the stacking direction, the insulating film further including a portion separated from the semiconductor pillar via the second portion,
   wherein the semiconductor body includes a third portion extending the stacking direction, and provided between the first portion and the insulating film.

2. The device according to claim 1, wherein the first portion extends from a portion surrounded with the plurality of electrode layers to a portion surrounded with the semiconductor pillar.

3. The device according to claim 2, wherein the semiconductor pillar includes a damage portion provided between the semiconductor pillar and the first portion.

4. The device according to claim 1, further comprising a film provided on the semiconductor pillar, wherein
   the film is in contact with the upper surface of the semiconductor pillar and a side surface of the second portion, and is surrounded with the insulator.

5. The device according to claim 4, wherein the film is silicon oxide.

6. The device according to claim 1, wherein an upper surface of the second portion is in contact with a lower surface of the charge storage film.

7. The device according to claim 1, wherein
   the insulating film includes a cover insulating film provided between the charge storage film and the insulator, and
   a lower surface of the cover insulating film is in contact with the upper surface of the semiconductor pillar.

8. The device according to claim 7, wherein outside of a side surface of the cover insulating film is coplanar with a side surface of the semiconductor pillar.

9. The device according to claim 1, wherein the second portion is separated from the insulator.

10. The device according to claim 1, wherein, as viewed in the stacking direction, a maximum diameter of the second portion is larger than a maximum diameter of the first portion.

11. The device according to claim 1, wherein
    the semiconductor body includes a fourth portion provided between the third portion and the charge storage film, along the stacking direction, wherein
    the charge storage film is provided between the second portion and the fourth portion.

12. The device according to claim 11, wherein, as viewed in the stacking direction, a maximum diameter of the second portion is larger than a maximum diameter of the fourth portion.

* * * * *